United States Patent [19]
Rezvani et al.

[11] Patent Number: 5,949,239
[45] Date of Patent: Sep. 7, 1999

[54] TEST HEAD APPARATUS FOR USE IN ELECTRONIC DEVICE TEST EQUIPMENT

[75] Inventors: Saiid Rezvani, Los Gatos; J. Stephen Paine, San Jose; Joseph Foerstel, Santa Clara, all of Calif.

[73] Assignee: Altera Corporation, San Jose, Calif.

[21] Appl. No.: 08/739,871

[22] Filed: Oct. 31, 1996

Related U.S. Application Data

[60] Provisional application No. 60/026,830, Sep. 27, 1996.

[51] Int. Cl.⁶ .......................... G01R 31/02; G01R 1/073
[52] U.S. Cl. .................. 324/754; 324/158.1; 324/758
[58] Field of Search ................................ 324/754, 755, 324/760, 761, 762, 758, 158.1

[56] References Cited

U.S. PATENT DOCUMENTS

| | | | |
|---|---|---|---|
| 3,866,119 | 2/1975 | Ardezzone | 324/754 |
| 4,673,839 | 6/1987 | Veenendaal | 324/754 |
| 4,862,075 | 8/1989 | Choi et al. | 324/754 |
| 4,918,383 | 4/1990 | Huff et al. | 324/754 |
| 5,321,453 | 6/1994 | Mori | 324/754 |
| 5,489,853 | 2/1996 | Nakajima | 324/754 |
| 5,559,446 | 9/1996 | Sano | 324/754 |
| 5,747,994 | 5/1998 | Suga | 324/158.1 |

*Primary Examiner*—Ernest Karlsen
*Attorney, Agent, or Firm*—William S. Galliani; Pennie & Edmonds LLP

[57] ABSTRACT

A test head apparatus for use in electronic device test equipment includes a test head with an annular test head body including a probe card carrier attachment region of a first circumference and a test electronic card storage region with a second circumference greater than the first circumference. The probe card carrier attachment region of the test head body is compatible with probe card carriers for existing test heads. The enlarged test electronic card storage region provides more space for electronic equipment, while providing more viewing area of the probe card. The apparatus also includes an improved probe card attachment configuration.

4 Claims, 5 Drawing Sheets

5,949,239

TEST HEAD APPARATUS FOR USE IN ELECTRONIC DEVICE TEST EQUIPMENT

This application claims priority to the provisional application entitled "Test Head Apparatus for Use in Electronic Device Test Equipment", Ser. No. 60/026,830, filed Sep. 27, 1996.

BRIEF DESCRIPTION OF THE INVENTION

This invention relates generally to the test head portion of electronic device test equipment. In particular, this invention relates to an improved test head apparatus with an enhanced test head body.

BACKGROUND OF THE INVENTION

Electronic device test equipment is widely used in the semiconductor industry to test electronic devices before they are shipped to a customer. Electronic device test equipment typically includes a test head which is used to electrically interface with a device that is to be tested. It is advantageous to place as much electronic circuitry in the test head as possible to reduce signal propagation delays. However, there are spacial limitations on how much electronic circuitry can be placed in a test head. For example, the test head must include a central aperture so that the electronic device to be tested can be visually observed to insure that proper electrical connections are established. It would be highly desirable to provide a test head with improved viewing capability and increased space for electronic circuitry. Such a test head should be compatible with existing device testing equipment.

SUMMARY OF THE INVENTION

A test head apparatus for use in electronic device test equipment includes a test head with an annular test head body including a probe card carrier attachment region of a first circumference and a test electronic card storage region with a second circumference greater than the first circumference. The probe card carrier attachment region of the test head body is compatible with probe card carriers for existing test heads. The enlarged test electronic card storage region provides more space for electronic equipment, while providing more viewing area of the probe card. The apparatus also includes an improved probe card attachment configuration.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
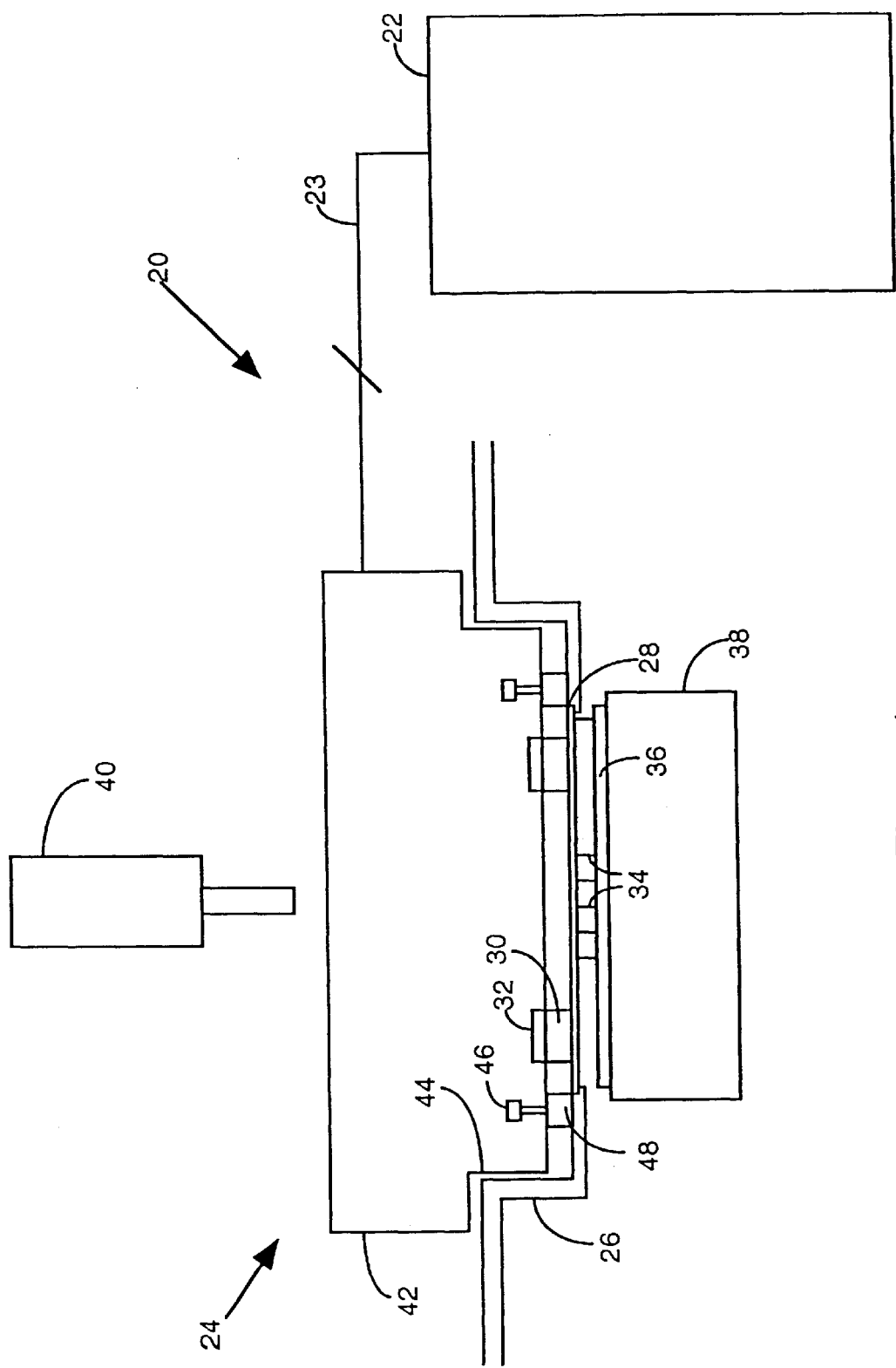
FIG. 1 is a side view of electronic device test equipment in accordance with an embodiment of the invention.

FIG. 1 is a side view of electronic device test equipment 20 in accordance with an embodiment of the invention. The equipment 20 includes a testing device 22 of the type known in the art. For example, the MEGAONE™ or VOYAGER™ testing devices sold by MEGATEST™ Corporation, San Jose, Calif. may be used. A bus 23 connects the testing device 22 to a test head 24 formed in accordance with the invention. The test head 24 rests on a probe card carrier 26 constructed in accordance with an embodiment of the invention. FIG. 1 illustrates that a probe card 28 is positioned within the probe card carrier 26. Positioned on top of the probe card 28 is at least one probe card electrical connector 30, which is physically and electrically connected to a corresponding test head electrical connector 32. One or more probes 34 extend from the probe card 28 and touch an electrical device 36, which is positioned on a wafer chuck 38. A microscope 40 is used to insure that the probes 34 of the probe card 28 are aligned with bond pads of the electrical device 36.

The test head 24 of the invention includes a novel test body configuration with a probe card carrier attachment region 44 of a first circumference and a test electronic card storage region 42 of a second circumference. There are a number of noteworthy benefits associated with this novel design. First, the probe card carrier attachment region 44 may be sized to conform to existing probe card carriers 26. Thus, the invention is compatible with a large installed base of equipment. In addition, the configuration of the test head 24 is advantageous because the test electronic card storage region 42 provides additional space for storing electronic test equipment. This additional space may be used to enlarge the central aperture of the test head 24, and thereby provide enhanced viewing for the microscope 40.

FIG. 1 also illustrates a probe card fastening device 46 on the test head 24 that is positionally aligned with an angled probe card engagement member 48 on the probe card carrier 26, the combination of these elements is referred to as a probe card attachment configuration. Each probe card fastening device 46 on the test head 24 may be implemented with a grip region with a relatively large circumference and a threaded shaft with a relatively narrow circumference. Each angled probe card engagement member 48 is in contact with the probe card fastening device 46 and is positioned in response to it, as discussed below.

Figure 2:
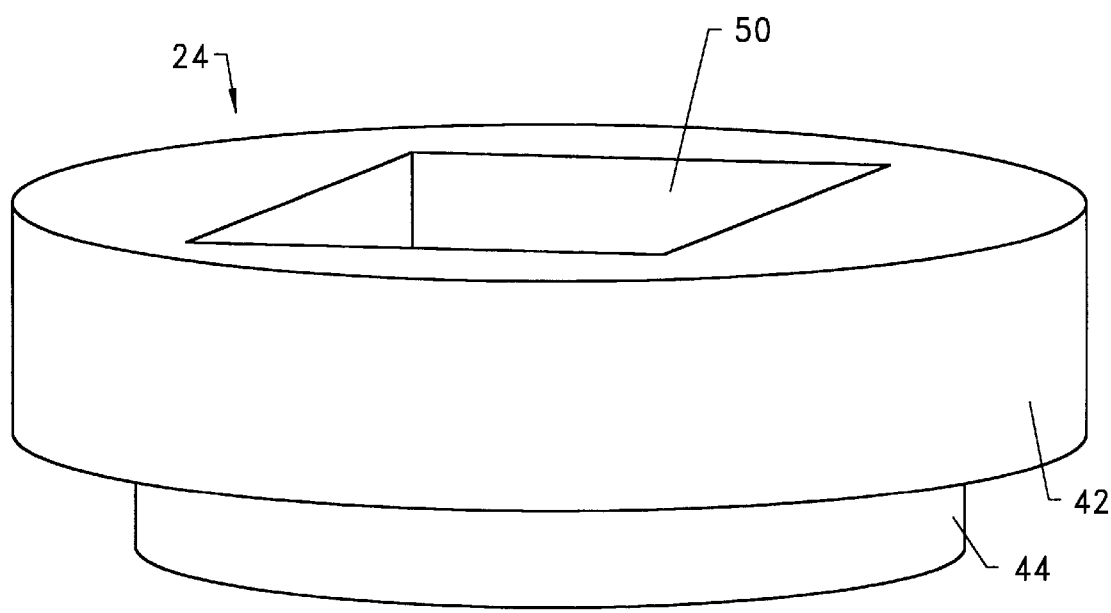
FIG. 2 is a perspective view of a test head in accordance with an embodiment of the invention.

FIG. 2 is a perspective view of the test head 24 of the invention. The figure illustrates the probe card carrier attachment region 44 and the test electronic card storage region 42. Further, the figure illustrates that the test head 24 defines a central aperture 50, which is used for viewing by the microscope 40.

Figure 3:
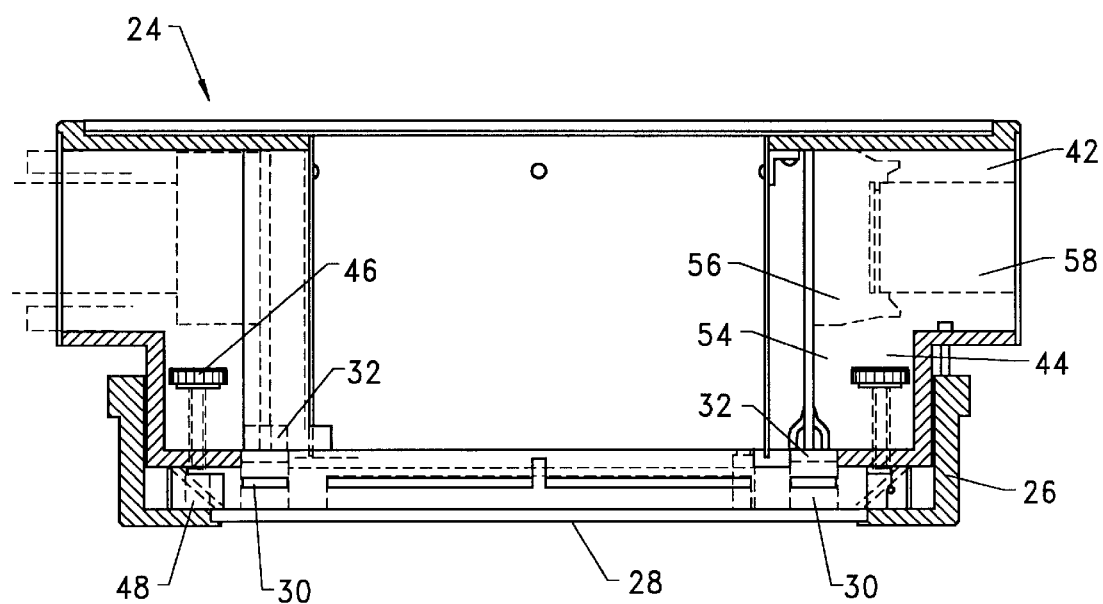
FIG. 3 is a more detailed side view of a test head and probe card carrier in accordance with an embodiment of the invention.
Figure 4:
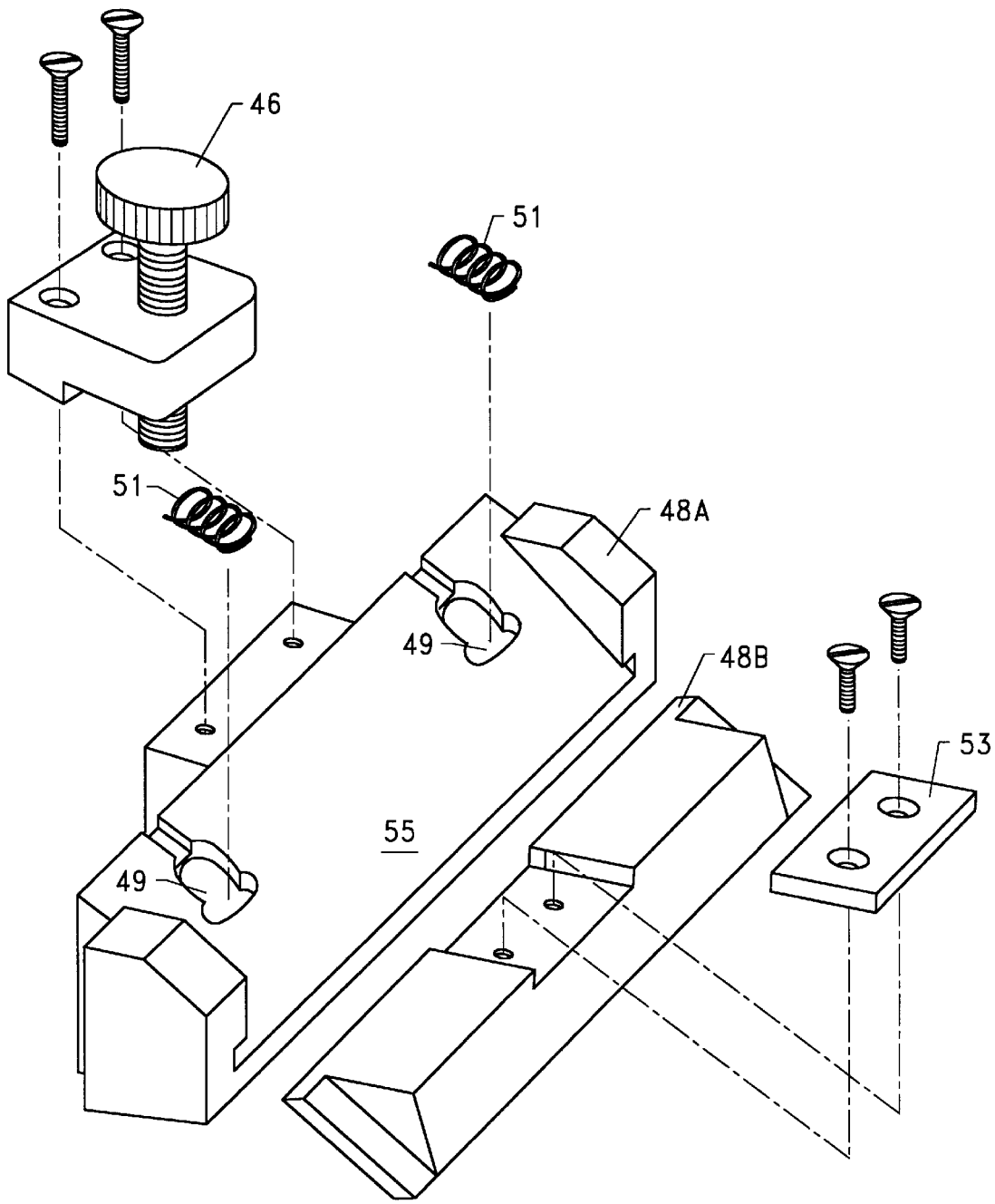
FIG. 4 is an exploded view of a probe card attachment configuration in accordance with an embodiment of the invention.

FIG. 3 is a more detailed side view of the test head 24 and probe card carrier 26 of the invention. The figure illustrates a probe card fastening device 46 which is connected to the angled probe card engagement member 48. FIG. 4 provides an exploded view of these elements.

The angled probe card engagement member 48 includes a base portion 48A and a sliding portion 48B. The base portion 48A includes wells 49 for holding springs 51. The sliding portion 48B has positionally aligned wells (not shown). Consequently, the springs 51 are housed in a void defined by the aligned wells. When the fastening device 46 is turned in a first direction, it presses against the plate 53 of the sliding portion 48B. This causes the sliding portion 48B to slide down the angled surface 55 of the base portion 48A.

Eventually, the sliding portion 48B engages the probe card 28 (not shown in FIG. 4). When the fastening device 46 is turned in a second direction, it is lifted from the plate 53 of the sliding portion 48B. As a result, the springs 51 force the sliding portion 48B up the angled surface 55 of the base portion 48A.

The inventors have identified that the use of a probe card attachment configuration, as shown in FIG. 4, provides for a more accurate positioning of the probe card. Preferably, the angled surface 55 is positioned at an angle between 20 and 70 degrees, more preferably at an angle between 35 and 55 degrees, and most preferably at an angle of approximately 45 degrees.

Returning once again to FIG. 3, the figure also illustrates the probe card electrical connector 30 attached to the test head electrical connector 32. The test head electrical connector 32 is attached to a test electronic card 54. A test electronic card connector 56 extends from the test electronic card 54. A ribbon cable 58 is attached to the test electronic card connector 56. It can be appreciated in FIG. 3 that the configuration of the test head 24 allows for a relatively large amount of space for the test electronic card connector 56 and ribbon cable 58.

Figure 5:
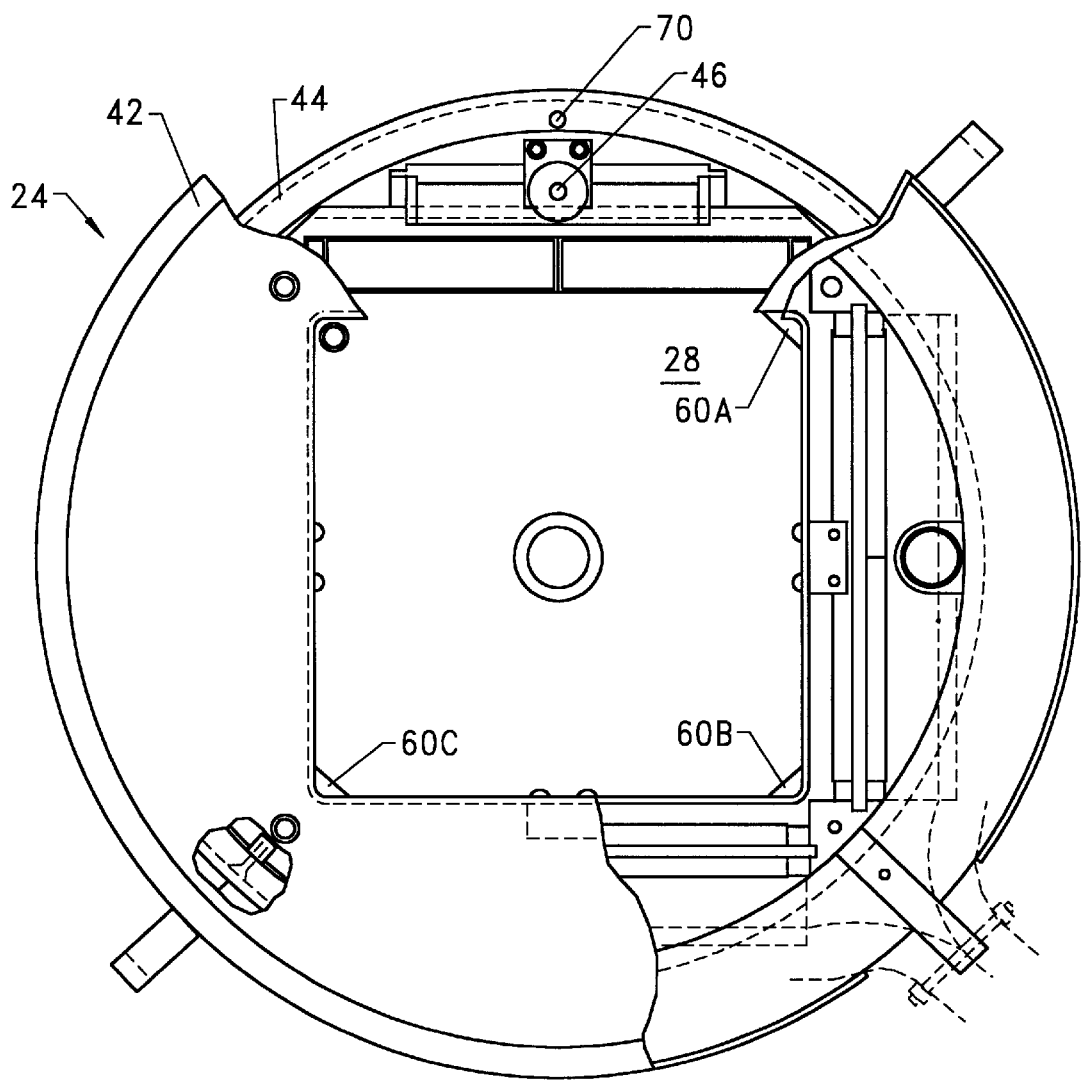
FIG. 5 is a top view of a test head in accordance with an embodiment of the invention.

Turning now to FIG. 5, illustrated therein is a top view of the test head 24 of the invention. The figure illustrates the test electronic card storage region with a relatively large circumference and the probe card carrier attachment region of a relatively small circumference. The figure also illustrates the probe card 28. Preferably, the test head 24 is configured to engage the probe card in only one position. In the embodiment of FIG. 5, ledges 60A, 60B, and 60C are used for a keyed fit with the probe card 28. In other words, the ledges 60A–60C insure that the probe card 28 will only fit in the test head 24 in one position.

FIG. 5 also illustrates that the test head 24 includes a test head pin 70. The test head pin 70 is used for alignment with the probe card carrier 26. That is, the probe card carrier 26 preferably includes an aperture to receive the test head pin 70 in an aligned position. If the aperture and the test head pin 70 are not aligned, then the test head 24 and the probe card carrier 26 cannot engage one another.

The apparatus of the invention has been described in reference to a probe card. However, it should be appreciated that the same apparatus can also be used with device-under-test (DUT) systems.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. A test head apparatus for use in electronic device test equipment, comprising:

a test head with an annular test head body including a test electronic card storage region with a first circumference and a probe card carrier attachment region of a second circumference less than said first circumference, said probe card carrier attachment region including a probe card attachment configuration including a probe card fastening device engaging an angled probe card engagement member, said angled probe card engagement member including a base portion with an angled surface and a sliding portion positioned on said angled surface.

2. The apparatus of claim 1 wherein said base portion and said sliding portion include aligned wells.

3. The apparatus of claim 2 further comprising a spring positioned in said aligned wells.

4. The apparatus of claim 3 wherein said fastening device is used to push said sliding portion in a first direction and said spring is used to bias said sliding portion in a second direction opposite said first direction.

* * * * *